United States Patent
Schaefer et al.

(10) Patent No.: US 9,994,952 B2
(45) Date of Patent: Jun. 12, 2018

(54) UV IRRADIATION APPARATUS WITH AN ADDITIONAL MONOCHROMATIC RADIATION SOURCE

(71) Applicant: Oerlikon Surface Solutions AG. Trübbach, Trübbach (CH)

(72) Inventors: Ruediger Schaefer, Grafenhausen (DE); Martin Kaspar, Mels (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 250 days.

(21) Appl. No.: 14/785,602

(22) PCT Filed: Apr. 14, 2014

(86) PCT No.: PCT/EP2014/000990
§ 371 (c)(1),
(2) Date: Oct. 19, 2015

(87) PCT Pub. No.: WO2014/170004
PCT Pub. Date: Oct. 23, 2014

(65) Prior Publication Data
US 2016/0090648 A1    Mar. 31, 2016

Related U.S. Application Data

(60) Provisional application No. 61/813,216, filed on Apr. 18, 2013.

(51) Int. Cl.
| | | |
|---|---|---|
| C23C 14/58 | (2006.01) | |
| B05D 7/00 | (2006.01) | |
| B05D 3/06 | (2006.01) | |
| B05D 7/02 | (2006.01) | |
| B05D 3/02 | (2006.01) | |

(52) U.S. Cl.
CPC ............ *C23C 14/58* (2013.01); *B05D 3/067* (2013.01); *B05D 7/02* (2013.01); *B05D 7/57* (2013.01); *B05D 3/0209* (2013.01); *B05D 7/53* (2013.01); *B05D 2490/50* (2013.01)

(58) Field of Classification Search
None
See application file for complete search history.

(56) References Cited

U.S. PATENT DOCUMENTS

| | | | | |
|---|---|---|---|---|
| 5,106,651 A | * | 4/1992 | Tyger | B05D 3/066 427/379 |
| 6,190,483 B1 | | 2/2001 | Yang et al. | |
| 6,399,152 B1 | * | 6/2002 | Goodrich | B05D 5/068 204/192.1 |
| 6,432,491 B1 | * | 8/2002 | Blatter | B05D 3/0263 427/385.5 |
| 7,132,130 B1 | | 11/2006 | Klass | |
| 2002/0168501 A1 | * | 11/2002 | Sigel | B05D 5/061 428/195.1 |
| 2005/0171227 A1 | * | 8/2005 | Weine Ramsey | B05D 7/14 522/1 |
| 2005/0214453 A1 | | 9/2005 | Kawanishi | |
| 2007/0111007 A1 | * | 5/2007 | Wilkenhoener | B05D 3/0209 428/411.1 |
| 2010/0112293 A1 | | 5/2010 | Li et al. | |
| 2010/0147457 A1 | * | 6/2010 | Mirou | D21H 25/06 156/273.3 |

FOREIGN PATENT DOCUMENTS

| | | |
|---|---|---|
| DE | 3529800 A1 | 3/1986 |
| JP | S575870 A | 1/1982 |
| JP | H0418406 A | 1/1992 |
| JP | 2008248084 A | 10/2008 |
| WO | 2013002842 A1 | 1/2013 |

* cited by examiner

*Primary Examiner* — Nicole Buie-Hatcher

(57) ABSTRACT

A component, the surface of which is at least partially covered with a coating, wherein the coating comprises a PVD coating arranged between a first paint layer and a second paint layer and the first paint layer forms a base coat layer on the surface and the second paint layer forms a top coat layer having a top coat thickness on the PVD coating, wherein at least the top coat layer was produced with UV-curable paint. Proceeding from the interface of the PVD coating in a region smaller than the top coat thickness, the top coat layer has a lower degree of cross-linking induced by UV light than in the part of the top coat layer connected to said region. The invention relates in particular to a method for producing such a component.

6 Claims, 1 Drawing Sheet

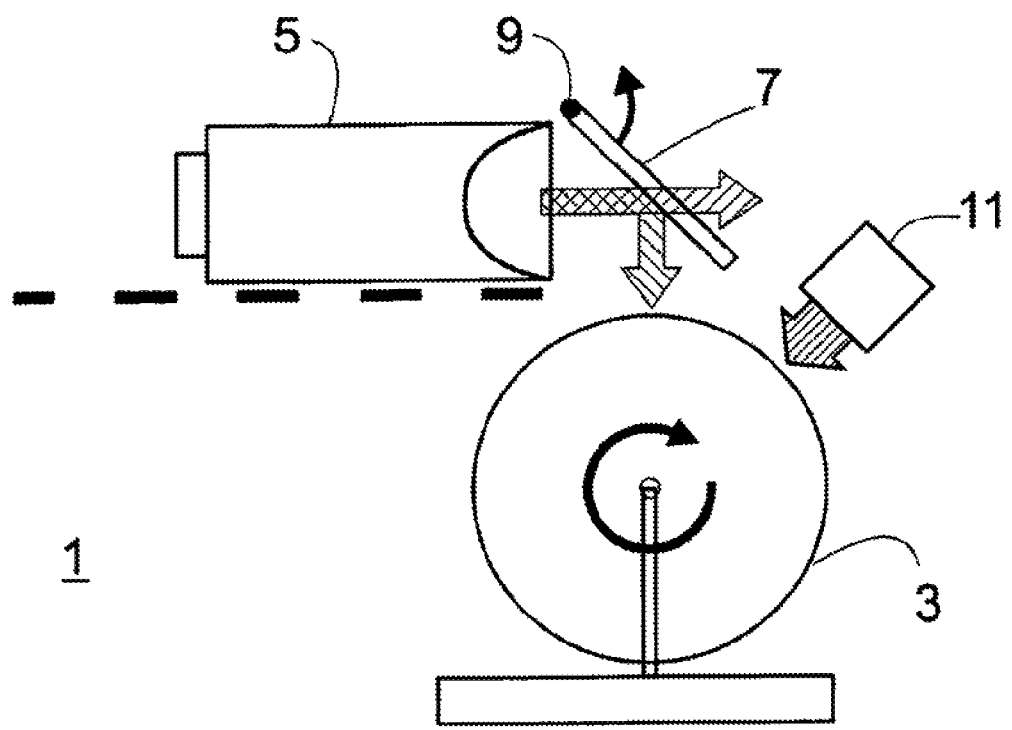

UV IRRADIATION APPARATUS WITH AN ADDITIONAL MONOCHROMATIC RADIATION SOURCE

FIELD OF THE INVENTION

The present invention relates to a method for UV cross-linking of paint layers. The invention also relates to an irradiation apparatus for carrying out the method.

BACKGROUND OF THE INVENTION

Paints applied to substrates are cured and dried by means of UV cross-linking. The paint remains fluid until it is cross-linked and can be abruptly hardened after application on a substrate.

As the UV radiation source, in most cases, a radiation source is used which emits both UV radiation and visible light and a high percentage of infrared radiation (IR radiation). The high percentage of IR radiation leads to high processing temperatures which can damage the substrates to be irradiated. A mercury-vapor lamp can be mentioned as an example of such a radiation source. In particular if the painted substrates are plastic substrates, critical temperatures are often reached if the conventional irradiation is used. For the plastic material known as ABS, for example, temperatures of 85° C. should not be exceeded.

However, during the cross-linking of such paints, two competing effects have to be reconciled: on the one hand, such surfaces should be as resistant to scratching as possible. Particularly in the field of the automotive industry, resistance to micro-scratching, for example in the context of the resistance against car wash facilities, is a recurring issue. On the other hand, however, the layers have to have good adherence to the surface.

For components applied in the exterior area of vehicles, such as trim strips or radiator grilles, it is often desirable to have a metallic look. However, these components are often based on plastic substrates, which are provided with a metallic look by means of coating. According to a very promising method, first a paint layer (basecoat) is applied to these substrates, among other things, to smooth the surface. Subsequently, one or more mainly metallic layers are applied, such as by means of PVD (physical vapor deposition). These layers give the component its metallic look. Hereafter, the PVD layer is covered in high-gloss or mat finish by means of an essentially transparent UV-curable paint (topcoat).

On the one hand, the outer paint layer (topcoat) now has to have the above-mentioned resistance to micro-scratching. This can be achieved, for example, by means of an increased degree of cross-linking. A drawback of this is, however, that the increased cross-linking of the paint layers leads to an increased brittleness caused by, among other things, increased shrinking during polymerization.

On the other hand, the topcoat and the PVD layer have different coefficients of thermal expansion. If, for example, the temperature changes or mechanical stresses occur, when the underlying material changes its extension corresponding to a different coefficient of thermal expansion, the above-mentioned increased brittleness with stronger cross-linking, has the effect that the paint no longer adheres on the material and thus flakes. In particular also in the context of stone chipping, such a brittle paint can additionally lead to fatal flaking of the paint.

It is thus desirable to provide a paint having good resistance against micro-scratching without being brittle.

SUMMARY OF THE INVENTION

The present invention is therefore based on the object to provide a paint having good resistance against micro-scratching without showing the drawback of increased brittleness.

The invention also has the object to provide a method according to which a paint layer can be manufactured having good resistance against micro-scratching without having the drawback of increased brittleness. In particular, the method can be carried out under atmospheric conditions, i.e. an inert gas atmosphere is not necessary.

According to the invention, the object is achieved by applying, in addition to the mercury-vapor lamp known from the state-of-the-art, after a predefined period of time, an additional monochromatic UV-C lamp (e.g. directly irradiating the object).

Put in very simple terms, this has the effect that the polychromatic mercury-vapor lamp cross-links the bulk and the short-wave UV-C lamp, with its very small penetration depth, more strongly cross-links the surface. Much higher surface hardnesses are thus achieved without leading to increased brittleness of the entire paint.

The invention will now be explained in detail as an example with reference to the accompanying drawing.

BRIEF DESCRIPTION OF THE DRAWING

The FIGURE is a schematic view of irradiation apparatus used for UV cross-linking of paint layers.

DETAILED DESCRIPTION OF THE PREFERRED EMBODIMENTS

The FIGURE shows an apparatus 1 for cross-linking of substrates coated with UV paint, arranged on a spindle 3. As indicated by the arrow, the spindle slowly rotates in the clockwise direction. Above the spindle, a high-pressure mercury-vapor lamp 5 is arranged, emitting a wide spectrum of radiation, comprising UV, visible and IR radiation, indicated by the arrow end provided with crosshatching.

This radiation impinges on a cold, light mirror 7 rotated at an angle of 45° with respect to the main radiation direction. The cold light mirror 7 essentially reflects the UV light downwards towards the spindle and essentially transmits visible light, and IR radiation.

UV light from the high-pressure mercury-vapor lamp 5 impinging on the surface of the painted substrates arranged on the spindle, is absorbed by the paint layer and leads to the polymers in the paint essentially uniformly cross-linking to a certain degree. In the present example, the substrates are exposed to the UV radiation of the mercury-vapor lamp for about 120 seconds. Switching the radiation on and off is achieved by switching the mercury-vapor lamp on and off or by rotating the cold light mirror 7 into or out of the radiation path of the mercury-vapor lamp, preferably about an axis 9, which is outside of the radiation path.

The FIGURE also shows a UV-C lamp 11 essentially emitting monochromatic radiation of the 254 nm wavelength toward the spindle surface. The substrates are additionally irradiated with this radiation, but at a time later than the broadband irradiation of the mercury-vapor lamp 5. With the rotating spindle, this can be achieved, for example, by frequently switching the UV-C lamp 11 on and off in such a way that for 50% of the time no UV-C radiation impinges on the spindle. Another possibility is to provide a shutter between the spindle and the UV-C lamp which absorbs the radiation of the UV-C lamp. A mirror periodically inserted into the radiation path of the UV-C lamp is also suitable. A plurality of mirrors could also be assembled, for example, to create a rotating mirror drum.

The monochromatic UV-C radiation only has a very small penetration depth in the paint surface and thus only additionally cross-links the surface region of the paint. In this way, a very hard surface results, which is thus extremely resistant to micro-scratching, without leading to increased brittleness of the entire paint layer.

If, for example, the temperature changes or mechanical stresses occur, the paint having a smaller degree of cross-linking disposed between the paint substrate changing its spatial dimensions and the additionally cross-linked and thus hardened paint surface region, forms a type of elastic buffer. The paint continues to adhere to the substrate and there is no flaking. On the other hand, the additionally cross-linked and thus hardened surface is many times more resistant against scratching than the underlying paint layer.

The use of the cold light mirror for the radiation of the mercury-vapor lamp, preferably in the above-shown combination with the UV-C lamp, is particularly advantageous when the non-cross-linked paint has a temperature substantially higher than room temperature. This is the case, for example, when after the application of the paint it is exposed to intense IR radiation, for example, to speed up the evaporation of any solvents. In this case, 70° C. are easily reached by the IR pre-treatment. Applying the unfiltered radiation of the mercury-vapor lamp would increase the temperature of the paint in excess of the allowed temperature. By using the cold light mirror, this risk is avoided. Increasing the starting temperature leads to an acceleration of the cross-linking speed. Due to the lack of the visible and IR components of the radiation, there is, however, no excessive further heating.

The component has been disclosed having a surface at least partially covered by a coating, wherein the coating comprises a PVD coating arranged between a first paint layer and a second paint layer, and the first paint layer forms a basecoat layer on the surface, and the second paint layer forms a topcoat layer with a topcoat thickness on the PVD coating, wherein at least the topcoat layer is made using a UV-curable paint. Proceeding from the interface of the PVD coating, in a region smaller than the topcoat thickness the topcoat layer has a smaller degree of cross-linking induced by UV light than in the part of the topcoat layer adjacent to this region.

Preferably the degree of cross-linking of the topcoat layer is highest at the interface to the environment.

It is also possible for the basecoat layer to be made of UV-curable paint.

The PVD layer can comprise two layers, and can preferably have been made of a plurality of PVD layers.

A method for the manufacture of the component having a metallic, finish has been disclosed having the following steps:

providing a plastic substrate having a surface to be coated;
painting the surface with a basecoat layer;
applying a PVD coating on the surface painted with the basecoat layer;
painting the PVD coating with a UV-curable topcoat layer;
applying UV light to the topcoat layer, wherein at fist a mercury-vapor lamp and subsequently a narrow-band, preferably monochromatic UV radiation source is used as the radiation source.

This method allows the above-described inventive components to be manufactured.

In the method, the light of the mercury-vapor lamp is preferably filtered by means of a cold light mirror before it impinges on the topcoat layer.

The invention claimed is:

1. A component having a surface at least partially covered by a coating, wherein the coating comprises:
a PVD coating arranged between a first paint layer and a second paint layer, and the first paint layer forms a basecoat layer on the surface, and the second paint layer forms a topcoat layer with a topcoat thickness on the PVD coating, wherein at least the topcoat layer is made using a UV-curable paint, and wherein, proceeding from an interface of the PVD coating, in a region smaller than a topcoat thickness, the region has a smaller degree of cross-linking induced by UV light than in a part of the topcoat layer adjacent to this region.

2. The component according to claim 1, wherein the degree of cross-linking of the topcoat layer is highest at an interface to the environment.

3. The component accosting to claim 2, wherein the basecoat layer is also made of a UV-curable paint.

4. The component according to claim 3, wherein the PVD coating comprises at least two layers and is made of a plurality of PVD layers.

5. A method of manufacturing a component having a metallic finish, comprising the steps of:
providing a plastic substrate having a surface to be coated;
painting the surface with a basecoat layer;
applying a PVD coating on the surface painted with the basecoat layer;
painting the PVD coating with a UV-curable topcoat layer;
applying UV light to the topcoat layer, wherein at first a mercury-vapor lamp and subsequently a narrow-band, monochromatic UV radiation source is used as a radiation source, resulting in the component having a coating wherein, proceeding from an interface of the PVD coating, in a region smaller than a topcoat thickness, the region has a smaller degree of cross-linking induced by the UV light than in a part of the topcoat layer adjacent to this region.

6. The method according to claim 5, comprising filtering the light of the mercury-vapor lamp using a cold light mirror before the light impinges on the topcoat layer.

* * * * *